United States Patent [19]

Marcoux

[11] Patent Number: 4,723,113
[45] Date of Patent: Feb. 2, 1988

[54] VERY HIGH FREQUENCY HARMONIC GENERATOR

[75] Inventor: Jean-Félicien Marcoux, Montigny le Bretonneux, France

[73] Assignee: Enertec, Montrouge, France

[21] Appl. No.: 903,350

[22] Filed: Sep. 3, 1986

[30] Foreign Application Priority Data

Sep. 6, 1985 [FR] France ............................. 85 13241
Sep. 6, 1985 [FR] France ............................. 85 13242

[51] Int. Cl.$^4$ ........................................... H03B 19/14
[52] U.S. Cl. ..................................... 331/76; 307/501; 307/304
[58] Field of Search .................... 331/76, 77; 363/163; 328/16, 17; 307/499, 501, 304; 455/333

[56] References Cited

U.S. PATENT DOCUMENTS 2,926,312  2/1960  Brand et al. ........................ 331/77
4,563,772  1/1986  Beneking et al. .................... 455/333

OTHER PUBLICATIONS

L'Onde Electrique, vol. 65, No. 1, Jan., Feb. 1985, pp. 23-26, Paris, FR; A. Elias Fuste et al., "Melangeur sous Harmonique a Mestec Asga".
Conference Proceedings, 7th European Microwave Conference, Sep. 5-8, 1977, Copenhagen, pp. 101-104, Microwave Exhibitions and Publishers Ltd.
IEEE Transactions on Microwave Theory and Techniques, vol. MTT-33, No. 2, Feb. 1985, pp. 105-110, IEEE, NY, US; Tadahiko Sugiura et al.
Conference Proceedings, 13th European Microwave Conference, Sep. 5-8, 1983, pp. 252-257, Nurnberg, NTG, Nachrichtentechnische Gesellschaft Im VDE.
IEEE Transactions on Microwave Theory and Techniques, vol. MTT-29, No. 3, Mar. 1981, pp. 261-263, IEEE, New York, US; Madhu S. Gupta et al.
IEEE Transactions on Microwave Theory and Techniques, vol. MTT-27, No. 5, May 1979, pp. 411-415, IEEE, New York, US; Philip T. Chen et al.

Primary Examiner—Siegfried H. Grimm
Attorney, Agent, or Firm—Dale Gaudier

[57] ABSTRACT

A very high frequency harmonic generator utilizes a type III-V (e.g. GaAs) FET. An input signal is applied to the gate of the FET at a sufficient level to induce non-linear functioning of the FET. This causes an output signal to appear between the source and drain having frequency components of at least the tenth harmonic of the input signal. The device is particularly applicable to the generation of microwave signals.

10 Claims, 8 Drawing Figures

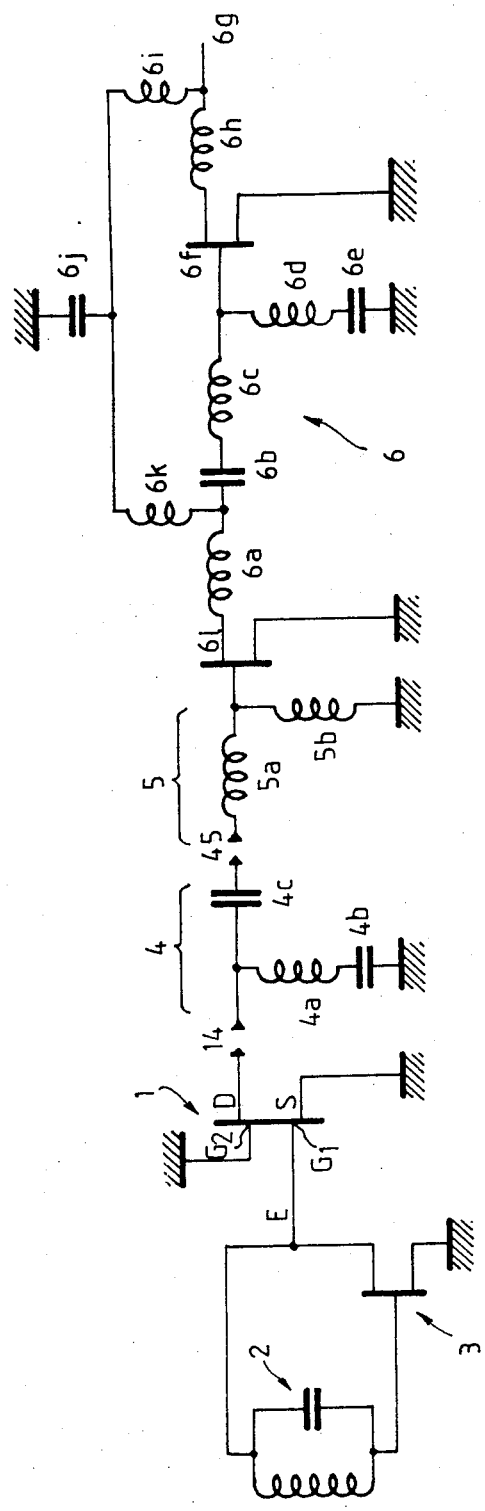
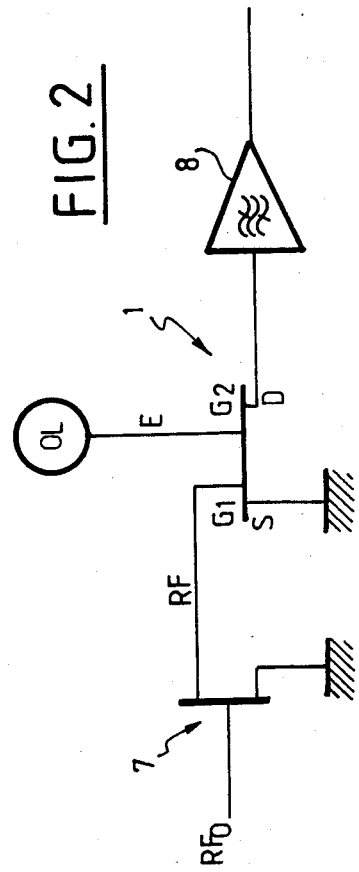
FIG.1
FIG.2

VERY HIGH FREQUENCY HARMONIC GENERATOR

This invention concerns a high frequency device producing input signal harmonics comprising: a type III-V semi-conductor field effect transistor, provided with at least three terminals, these being the source, drain and gate, together with input devices to apply the input signal to the gate using a voltage sufficient to induce non-linear functioning of the transistor, including output devices to receive, on one terminal of the transistor, an output signal related to at least one of the input signal harmonics.

A device of this type is already known and is, for example, described in the publication "IEEE Transactions on Microwave Theory and Techniques", volume MTT-27, no. 5, May 1979, or Volume MTT-30, no. 6, June 1982.

These two articles describe the suitability of field effect transistors, particularly gallium arsenide (GaAs) transistors, to form multipliers with a relatively low order of frequency, for example, order 2 or 3.

In general, these two articles comply with the present tendency to use type III-V semi-conductors, which are still relatively little used, specifically for handling signals where the frequency is too high to be adequately processed by applying more traditional techniques or technologies.

In particular, the two articles described above relate to basic research and describe experiments in doubling or tripling input signal frequencies which are already relatively high, equal to at least 4 GHz.

Within this context, the present invention may be considered to be an industrial application based on a discovery. More precisely, the invention rests on the discovery that type III-V semi-conductor field effect transistors are suitable to act as wide band harmonic generators with a very high order of frequency, for example, up to 200.

Not only has this property of field effect transistors not been noted during the experiments described above but it was neither observed or even considered.

In fact, it was not possible to observe this property for the reason that, as the input signals used were of relatively high frequency, the output signals which should have corresponded to a frequency multiplication of a high order were located beyond the range of frequencies actually capable of being accurately observed. Also, the output components for these earlier devices used when carrying out these experiments were specifically adapted to the emission of output signals within a narrow band centered on the frequency which would be observed on doubling or tripling the frequency and could not be adapted to the emission of wide band output signals or those corresponding to frequency multiplications considerably exceeding 2 or 3.

Also, this property of field effect transistors to act as very high frequency harmonic generators cannot be considered as having actually been required in the case of the earlier experiments described in the above articles. It would appear, in fact, as can be seen from reading the first of these articles, that the power losses between the input signal and the multiple frequency output signal increases noticeably when the order of multiplication increases, even when it only changes from 2 to 3.

As, also, these losses increase considerably with the frequency of the input signal and as the input signal voltage which was applied in the earlier experiments remains fairly low, corresponding for example to a maximum power of 15 dBm, these experiments could not result in the production of an output signal corresponding to a high order of frequency multiplication, providing sufficient power to be physically capable of being used or distinguished from noise.

However, in the case of the device comprising the invention, the input signal is applied with a frequency which, for the very high frequency (e.g. microwave) range concerned, is relatively low, and the output devices are suitable for receiving a signal corresponding to a frequency multiplication of a relatively high order.

More precisely, this device is essentially characterized in that the input signal has a frequency of between 50 MHz and 2.5 GHz and in that the output devices are suitable to receive and use, as the output signal, a signal linked to at least one of the input signal harmonics of an order equal to at least 10.

Also, the input signal is, preferably, applied using a voltage of between three and five times the cut-off voltage for the conductive channel of the transistor.

Several methods of producing this device have proved to be very advantageous.

For example, the input devices may comprise an oscillator formed by a resonator looped onto an active component, the device then constituting a very high frequency generator with a wide spectrum, enabling very high frequency signals to be produced where the frequency is strictly controlled.

In effect, the frequency of the output signals is determined by that of the input signals and the frequency of these latter, being relatively low, may be controlled relatively easily.

In particular, these input devices may comprise a quartz oscillator providing, as the input signal, a signal which is at the resonance frequency for the quartz.

This device may therefore be used, for example, as a generator for a frequency regulator. If the input signal frequency is between 800 MHz and 2 GHz and, for example, in the vicinity of 1 GHz, the lines of the frequency regulator, which are relatively few but well spaced out, form a spectrum of reasonably uniform amplitude.

If the frequency of the input signal is less than 200 MHz and, preferably, between 50 and 150 MHz, the lines of the frequency regulator are very numerous and very close together.

In both these cases, the output devices may include a band-pass filter which, where necessary, is capable of being regulated in order to select one or more lines, the device then being usable as a very high frequency generator at a definite frequency which can, if required, be controlled.

The field effect transistor used is, preferably, a double gate transistor, the first gate being close to the source and the second gate close to the drain and the input signal is then preferably applied to the first gate. If the output signal is received on the drain, the second gate is preferably connected to earth, at least in the case of a signal at the output signal frequency.

However, the output signal may also be received on the second gate. The amplitude of the frequency spectrum for the output signal is more uniform over a particular frequency range when this signal is received on the second gate then when this signal is received on the drain.

Also, the signal received on the second gate is in the form of pulses of very short duration, for example, capable of being restricted to several tenths of picoseconds.

In another application, using a double gate type transistor, the input devices apply the input signal onto one of the gates and a signal for processing onto the other gate. The device then constitutes a wide band mixer with harmonic sampling, producing an output signal which is the result of mixing the signal being processed with the harmonics of the input signal.

Preferably, in this application, the signal being processed is applied to the gate close to the source and the input signal to the gate close to the drain.

Other characteristics and advantages of the invention will be evident from the following description, this being given for information only and is in no way to be considered limiting, by referring to the appended figures where:

FIG. 1 is a diagram of a device in accordance with the invention and which may be used as a very high frequency generator;

FIG. 2 is a diagram of a device in accordance with the invention, comprising a wide band mixer of a sampling gate;

Figure 3:
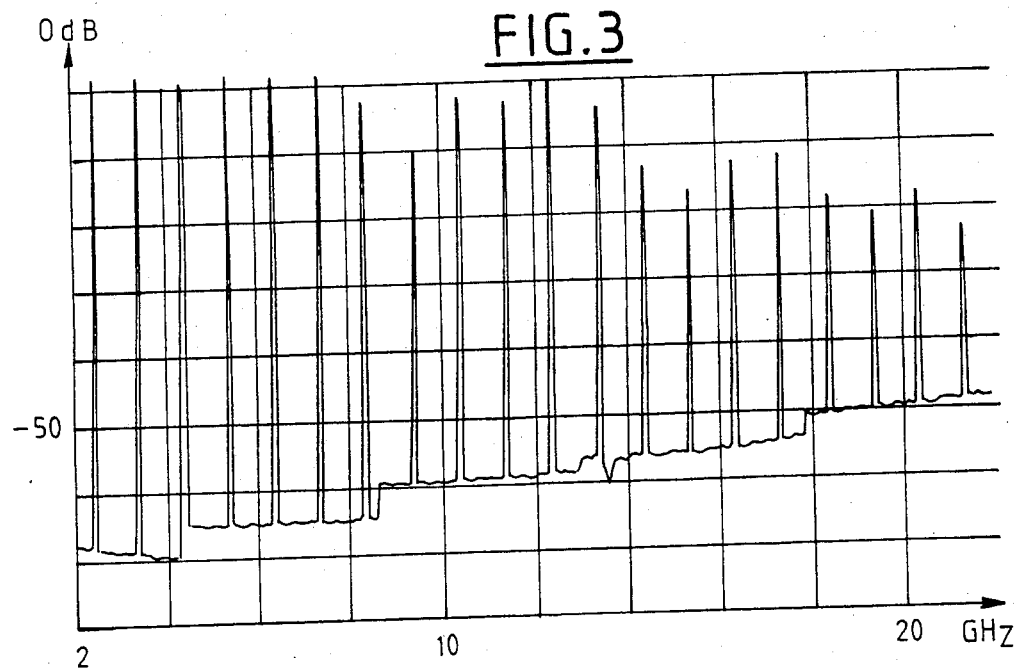
FIG. 3 shows the frequency regulator spectrum of a wide band signal produced in accordance with the invention.

The invention concerns the very high frequency application of type III-V semi-conductor field effect transistors, preferably gallium arsenide (GaAs) transistors with Schottky effect contact gate or gates (MESFET).

Transistors of this type are already knwn and, for example, marketed under the trade name "AVANTEK", reference AVANTEK 80 11 200, or under the trade name "NEC", reference NE 46 300 or NEC 720.

These transistors comprise at least three terminals, that is, a source, a drain and at least one gate, the source and the drain being located at the ends of an elongated channel and the gate or gates being in contact with the channel at intermediate positions between the source and the drain.

Traditionally, the gate closest to the source is known as the "primary gate" and the other as the "secondary gate".

In operation, the field effect transistor is polarized between the source and the drain and also between the source and each gate.

Also, an input signal is superimposed on the polarization voltage and applied to one of the gates.

A person skilled in the art knows that, for a certain polarization mode known as class A and for a relatively low voltage input signal, the transistor will function linearly, that is, variations in the output signal capable of being received on the drain are proportional to the variations in the input signal.

A person skilled in the art also knows that, for other transistor gate polarization modes, known as class B or class C and for a higher input signal voltage, the transistor will function in a non-linear manner. In this case, the output signal is distorted relative to the input signal. In particular, the transistor may only be conductive for time intervals of less than one-half of the input signal period.

In the case of the device comprising the invention, the field effect transistor is used in a highly non-linear manner, using class B or C polarization modes.

For example, in the case of a transistor with a cut-off voltage, that is, a voltage above which the transistor channel ceases to be conductive, in the order of $-1.2$ V, the gate (or the primary gate) of the transistor is polarized between $-1$ V and $-4$ V.

This input signal is, in accordance with the invention, applied with a voltage of approximately three to five times the cut-off voltage of the conductive channel, for example, 5 volts maximum value for a cut-off voltage of $-1.2$ V.

In terms of power, this means that this input signal is applied, for example in the case of transistors of the type described earlier, using a power of approximately 25 dBm (0 dBm corresponds to 1 milliwatt and the characteristic impedances are fixed at 50 ohms). Also, the drain-source voltage is approximately 6 to 7 volts and the drain current is approximately 80 mA.

FIG. 1 shows the circuit of a very high frequency generator.

The field effect transistor 1 may be of single gate type but may, more advantageously, be of double gate type as shown. The transistor then comprises a primary gate $G_1$ close to the source S and a secondary gate $G_2$ close to the drain D.

The input signal E is applied to the gate $G_1$, at a relatively low frequency of between 50 MHz and 2.5 GHz.

In a first type of application, this signal E is, for example, the output signal of an oscillator, comprising a resonator 2, for example, a quartz or an acoustic delay type circuit, looped into an active component 3, for example a single gate field effect transistor of NE 244 type, as manufactured by NEC. In this case, the input signal frequency E is, for example, less than 200 MHz, preferably, between 50 and 150 MHz and typically in the vicinity of 100 MHz if this signal is produced using a quartz crystal.

The frequency of signal E may be modified, by changing resonator 2 or its frequency. Signal E, when applied to transistor 1, has a high level of spectral purity and a frequency capable of being strictly controlled in accordance with normal techniques.

Figure 4:
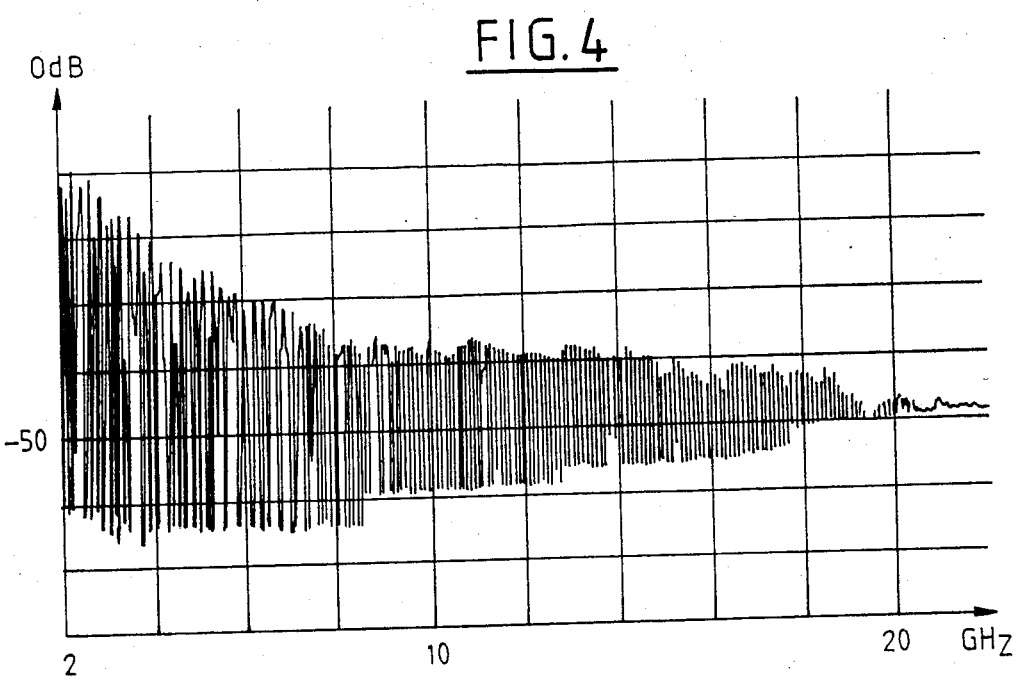
FIG. 4 shows another frequency regulator spectrum for a signal also produced in accordance with the invention.

The output signal, received on drain D for example, shows a very complete wide band frequency spectrum, as represented in FIG. 4, where the frequencies in gigahertz form the abscissae and the relative amplitudes in decibels form the ordinates.

One of the lines in this spectrum, corresponding to a frequency multiplication of a high order, for example at least equal to 10 or even exceeding 50 and typically of the order of 100, may be selected using the appropriate output devices, these being shown in FIG. 1 as a filter 4, an impedance adaptor 5 and a selective amplifier 6, functioning together as a very selective band-pass filter unit.

Figure 5:
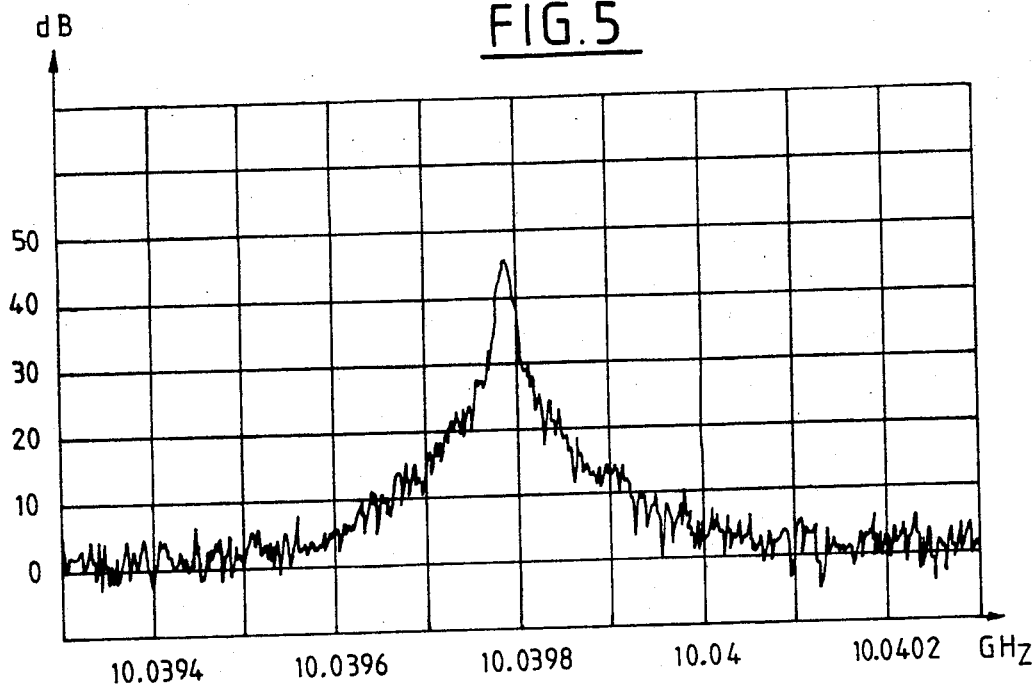
FIG. 5 shows the frequency spectrum for a 10 GHz line produced and selected by a device in accordance with the invention.

On applying an input signal E of 100 MHz at 25 dBm, this resulting in the appearance, on drain D of transistor 1, of the wide band output signal shown in FIG. 4, it is therefore possible to obtain, for example, at output 6 g of the selective amplifier 6, a 10 GHz filtered output signal, as shown in FIG. 5 where the frequencies in gigahertz form the abscissae and the relative amplitudes in decibels form the ordinates.

In this application, transistor 1 can be a single gate field effect transistor, for example a type NE 463 transistor manufactured by NEC, or a double gate transistor such as, for example, an AVANTEK 11200 type transistor as manufactured by the company AVANTEK. In this latter case, the secondary gate $G_2$ is, in the case of the very high frequency signals, connected to the earth. This secondary gate is also subject to a permanent positive polarization of approximately 1 to 2 volts, the current being limited to several milliamperes. This may be obtained, as is well known to persons skilled in the art, by connecting gate $G_2$ to the earth through a capacitor when the terminal directly connected to the gate is related to a positive potential.

Filter 4, connected to drain D by means of a coupling 14, comprises a self-inductance 4a of 1.8 nH and a capacitor 4b of 0.4 pF connected in series to the earth, for a very high frequency signal, together with an output capacitor 4c of 0.56 pF.

The impedance adapter 5 connected to filter 4 by means of a coupling 45 comprises two inductances 5a, 5b of 0.16 nH and 0.43 nH respectively, where the second is connected to earth for a very high frequency signal and where the common point is connected to the gate of a single gate field effect transistor 61. This transistor comprises the input device for the selective amplifier 6 and consists of, for example, a transistor manufactured by NEC, reference NE 388.

The selective amplifier 6, tuned to 10 GHz in the example shown, also comprises filtering devices, these comprising, in series, a self-inductance 6a of 1.2 nH, capacitor 6b of 1.65 pF and another self-inductance 6c of 0.65 nH.

The output of the self-inductance 6c is, for a very high frequency signal, connected to earth through a self-inductance 6d of 0.54 nH and a capacitor 6e of 8.4 pF and also to the gate of a single gate field effect transistor 6f comprising the second active component of the amplifier, for example, identical to transistor 61.

The drain of transistor 6f is connected to the output 6g of the circuit, by means of a self-inductance 6h of 0.63 nH.

The output 6g is, also, for a very high frequency signal, connected to earth by means of a self-inductance 6i of 0.18 nH and a capacitor 6j of 0.7 pF. An inductance 6k of 0.6 nH connects the common terminal of components 6a and 6b to the common terminal of components 6i and 6j.

The signal available at the output 6g may, for example, be applied to a variable gain amplifier (not shown), using a type AVANTEK AT 11200 double gate transistor.

The device of FIG. 1 may also very advantageously be produced as a monolithic assembly, this enabling the frequency band of signals produced to be further extended.

In another very similar form of application, the input signal E, applied to transistor 1, may have a frequency of between 800 mHz and 2 GHz, preferably in the vicinity of 1 GHz.

The output signal of transistor 1, which is received on the drain D for example and which always has the form of a wide band frequency regulator comprises lines spaced apart as shown in FIG. 3, comparable to FIG. 4.

In this form of application, as in the preceding, transistor 1 is preferably a double gate transistor and, if the output signal of transistor 1 is received on drain D of this latter, the secondary gate $G_2$ has preferably a positive polarization and, for a very high frequency signal, is connected to earth.

However, it is possible, in accordance with these two forms of application for the device, to receive the output signal of transistor 1 and gate $G_2$ of the latter.

Relative to the signal received on the drain, FIGS. 3 and 4 giving two examples, the signal received on the second gate of the transistor has two essential differences, one of these being within the frequency band and the other in the time band.

In the case of the frequency band difference, the signal received on the second gate $G_2$ has a more uniform frequency than the signal received on the drain D. More precisely, the amplitude ratio between the output signal corresponding to any order of multiplication equal to "x", at the input signal amplitude, varies, for a value of "x" itself varying over a given range, between extreme values which are closer to each other when the output signal is received on the second gate $G_2$ than when it is received on the drain D.

Figure 6A:
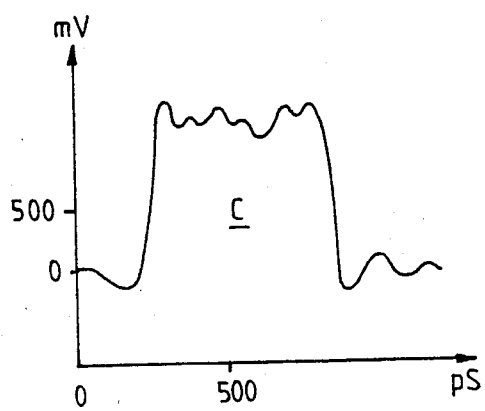
FIGS. 6A and 6B show the changes, in terms of time, in amplitude for output signals produced in accordance with the invention.
Figure 6B:
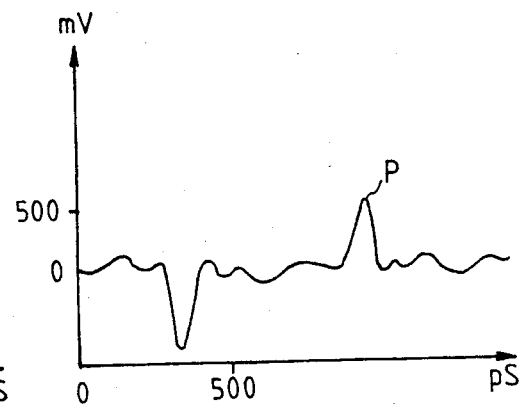

In the case of the time band, the difference is shown in FIGS. 6A and 6B, where the time in picoseconds is in the form of abscissae and the amplitude in millivolts is shown in the form of ordinates.

The output signal received on the drain D (FIG. 6A) is of square wave form such as C, its duration being approximately one-half of the inverse value for the input signal frequency.

On the other hand, the output signal received on the second gate $G_2$ (FIG. 6B) of transistor 1 is in the form of peaks, such as P, where the changes correspond to the derivative, in terms of time, for the flanks of the square waves C and which may be of very short duration, for example, approximately several tenths of a picosecond.

FIG. 2 shows an application of the device comprising the invention when applied to the mixing of signals and, more precisely, to the mixing of a signal being processed when the harmonics of an input signal.

The RF signal being processed, for example, obtained by amplification using a field effect transistor 7 from an initial signal $RF_o$, is applied to the primary gate $G_1$ of transistor 1.

The input signal E, for example comprising the 1 GHz output signal of a local oscillator OL, is applied to the secondary gate $G_2$ of transistor 1, with sufficient power, for example 25 dBm, to ensure that this transistor acts in a highly non-linear manner.

The signal capable of being received on the drain D of transistor 1 is a wide band signal, extending, for example, over a band of 20 GHz, resulting from mixing the RF signal being processed with the successive harmonics of the input signal E.

The output signal of transistor 1 may be filtered using a relatively narrow band filter, for example a low-pass or a band-pass filter 8 which supplies, at its output, a signal resulting from mixing the RF signal being processed with at least one high order harmonic of input signal E.

Figure 7:
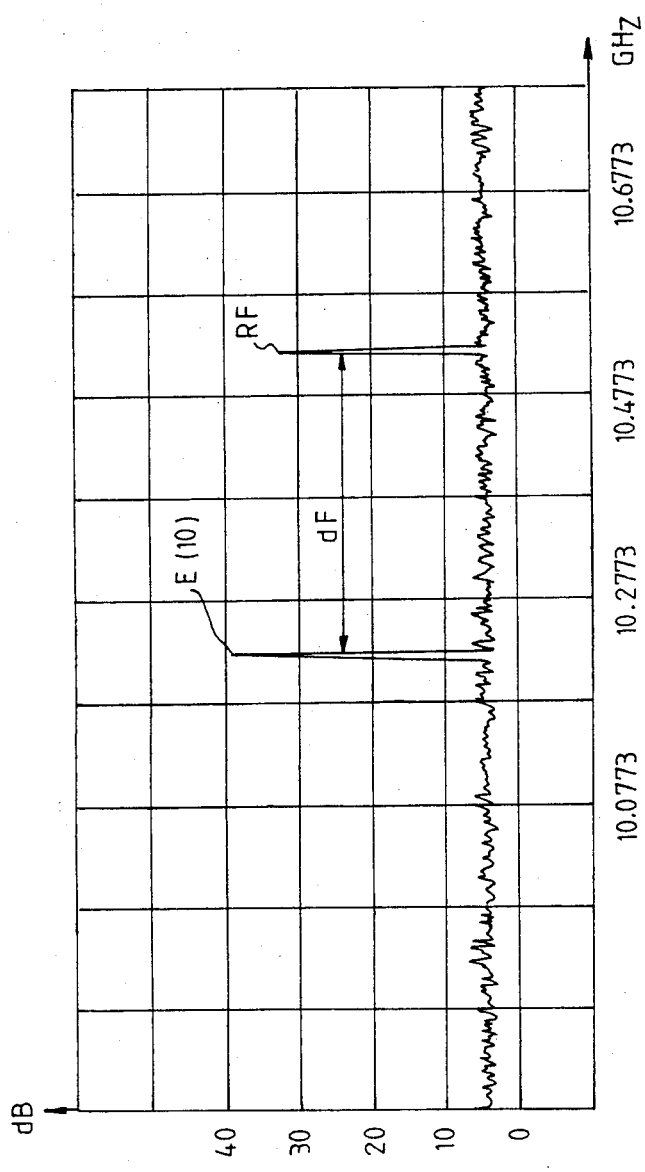
FIG. 7 shows part of the frequency spectrum for an output signal obtained from a wide band mixing device in accordance with the invention.

FIG. 7 gives the frequencies in gigahertz in the form of abscissae and the relative amplitudes in decibels in the form of ordinates and represents part of the spectrum, in the vicinity of 10 GHz, of the output signal received on drain D of transistor 1, this receiving a RF signal on the primary gate of approximately 10.5 GHz and on the second gate an input signal E of approximately 1.02 GHz.

FIG. 7 shows very clearly the simultaneous existence of the RF signal and the tenth harmonic E(10) of the input signal E, separated from the RF signal by a frequency shift dF of approximately 300 MHz.

We claim:

1. Device applicable to the generation of very high frequencies to produce harmonics of an input signal, comprising: a type III–V semiconductor field effect transistor with at least three terminals known as the source, drain and gate; input devices to apply the input signal to the gate at a sufficient voltage level to induce non-linear functioning of the transistor; and output devices to receive, on one terminal of the transistor, an output signal related to at least one of the harmonics of the input signal characterized in that the input signal has a frequency of between 50 MHz and 2.5 GHz and that the output devices are suitable to receive, as an output signal, a signal related to at least the tenth harmonic of the input signal.

2. Device in accordance with claim 1, characterized in that the input devices comprise an oscillator formed by a resonator associated with an active component.

3. Device in accordance with claim 1, characterized in that the input devices comprise a quartz oscillator providing, as an input signal, a signal at the resonance frequency of the quartz.

4. Device in accordance with claim 2, characterized in that the output devices comprise a band-pass filter.

5. Device in accordance with claim 1, characterized in that the transistor comprises two gates, the first being close to the source and the second close to the drain, the input signal being applied onto the first gate.

6. Device in accordance with claim 5, characterized in that the output signal is received on the drain and the second gate is connected to ground, at least in the case of a signal which is at the output signal frequency.

7. Device in accordance with claim 5, characterized in that the output signal is received on the second gate.

8. Device in accordance with claim 1, characterized in that the transistor comprises two gates and that the input devices apply the input signal onto one of the gates and a signal to be processed onto the other gate, this device comprising a wide band mixer with harmonic sampling producing, as an output signal, a signal resulting from mixing the signal being processed with the harmonics of the input signal.

9. Device in accordance with claim 8, characterized in that the signal being processed is applied to the gate close to the source and the input signal is applied to the gate close to the drain.

10. Device in accordance with claim 1, characterized in that the input signal is applied using a voltage of between 3 and 5 times the cut-off voltage of the transistor conductive channel.

* * * * *